United States Patent
Kumakura (10) Patent No.: US 8,816,888 B2
(45) Date of Patent: Aug. 26, 2014

(54) AD CONVERSION CIRCUIT, SEMICONDUCTOR DEVICE, AND AD CONVERSION METHOD

(71) Applicant: Fujitsu Semiconductor Limited, Yokohama (JP)

(72) Inventor: Yoshiaki Kumakura, Sagamihara (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 14/037,907

(22) Filed: Sep. 26, 2013

(65) Prior Publication Data

US 2014/0097978 A1    Apr. 10, 2014

(30) Foreign Application Priority Data

Oct. 4, 2012    (JP) .................................. 2012-221851

(51) Int. Cl.
*H03M 1/00*    (2006.01)
(52) U.S. Cl.
USPC ............................ 341/122; 341/143; 341/155

(58) Field of Classification Search
CPC ........................................................ H03M 1/00
USPC ........................................ 341/143, 122, 155
See application file for complete search history.

(56) References Cited

U.S. PATENT DOCUMENTS 7,855,668 B2 * 12/2010 Akizuki et al. ............... 341/143
8,193,957 B2    6/2012 Yoshioka

FOREIGN PATENT DOCUMENTS

| JP | 07-129279 A | 5/1995 |
| JP | 2007-324819 A | 12/2007 |
| JP | 2011-061597 A | 3/2011 |

* cited by examiner

*Primary Examiner* — Jean B Jeanglaude
(74) *Attorney, Agent, or Firm* — Arent Fox LLP (57) ABSTRACT

A reference voltage generator generates a reference voltage at the time of sampling a received input signal. A sampling time controller detects a change in the reference voltage. When the reference voltage rises to a determined threshold, the sampling time controller determines that sampling is completed, and generates a sampling clock in which sampling time is controlled on the basis of an external clock.

7 Claims, 12 Drawing Sheets

AD CONVERSION CIRCUIT, SEMICONDUCTOR DEVICE, AND AD CONVERSION METHOD

CROSS-REFERENCE TO RELATED APPLICATION

This application is based upon and claims the benefit of priority of the prior Japanese Patent Application No. 2012-221851, filed on Oct. 4, 2012, the entire contents of which are incorporated herein by reference.

FIELD

The embodiment discussed herein is related to an AD conversion circuit, a semiconductor device, and an AD conversion method.

BACKGROUND

A sequential comparison type AD (Analog to Digital) conversion circuit which includes a small number of analog circuits and which can be realized by the use of comparatively simple circuits is known. A sequential comparison type AD conversion circuit is significantly consistent with a CMOS (Complementary Metal-Oxide Semiconductor) process and can be made minute. Accordingly, sequential comparison type AD conversion circuits are used for various purposes.

Conversion methods that are adopted in sequential comparison type AD conversion circuits are of two types: a clock synchronization type and a clock non-synchronization type. With a clock synchronization type conversion an AD conversion is made one bit for each clock of an external clock.

With a clock non-synchronization type conversion, on the other hand, an AD conversion of all bits is made by one clock of an external clock. With a clock non-synchronization type conversion, for example, time for which an external clock is at an H (High) level is sampling time for which an input signal is sampled and time for which the external clock is at an L (Low) level is AD conversion time for which the sampled input signal is AD-converted.

In order to secure AD conversion time, the technique of using an external clock signal the duty ratio of which is controlled so as to make L level time longer than H level time or the technique of controlling time for which an external clock is at an L level for making an AD conversion with desired resolution was formerly proposed.

Japanese Laid-open Patent Publication No. 2011-61597

However, sampling of an input signal ends before the elapse of set sampling time, depending on the characteristics of an AD conversion circuit or conditions under which the AD conversion circuit operates. As a result, there may be extra sampling time.

SUMMARY

According to an aspect, there is provided an AD conversion circuit including a reference voltage generator which generates a reference voltage at the time of sampling a received input signal and a sampling time controller which detects a change in the reference voltage, which determines at the time of the reference voltage rising to a determined threshold that sampling is completed, and which generates a sampling clock in which sampling time is controlled on the basis of an external clock.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENT

An embodiment will now be described with reference to the accompanying drawings, wherein like reference numerals refer to like elements throughout.

Figure 1:
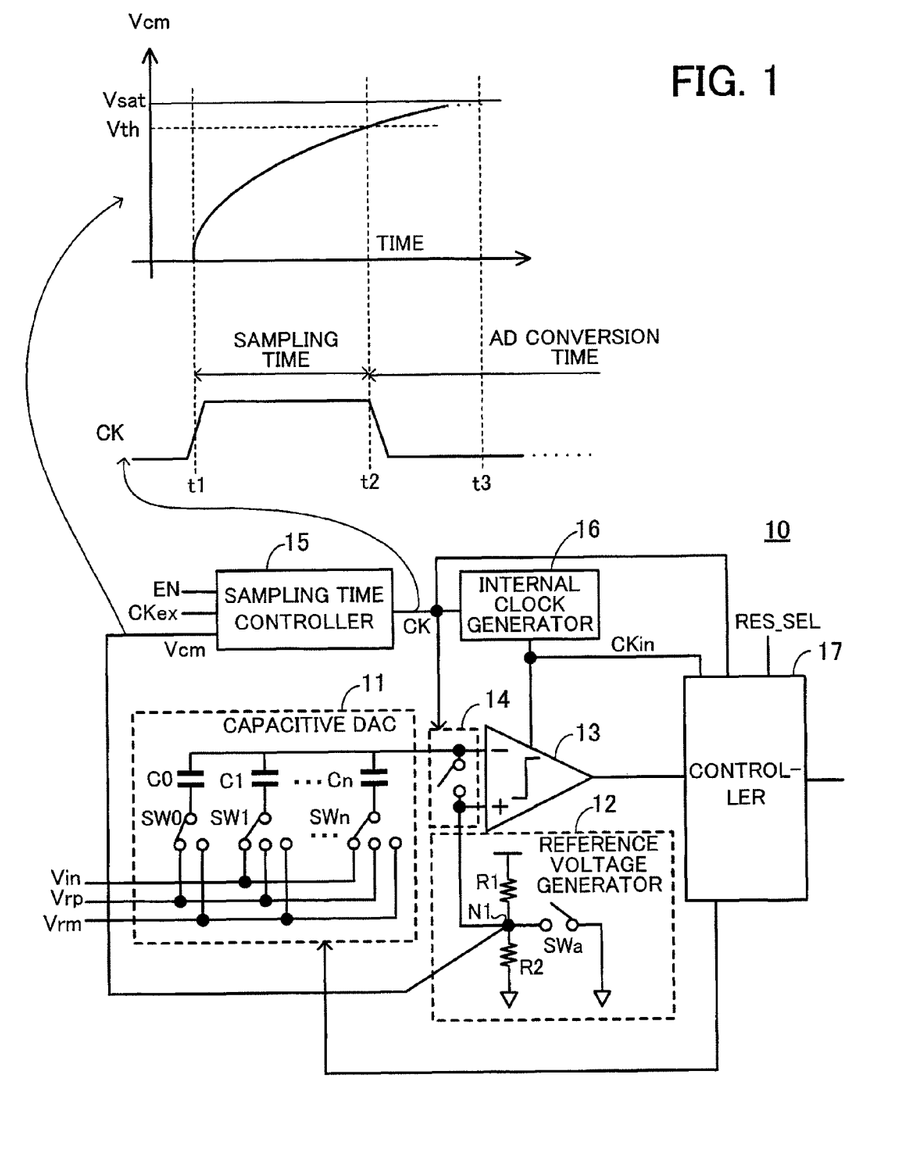
FIG. 1 indicates an example of an AD conversion circuit according to an embodiment.

FIG. 1 indicates an example of an AD conversion circuit according to an embodiment. An AD conversion circuit 10 illustrated in FIG. 1 is a clock non-synchronization and sequential comparison type AD conversion circuit.

The AD conversion circuit 10 includes a capacitive DAC (Digital to Analog Converter) 11, a reference voltage generator 12, a comparator 13, a switch 14, a sampling time controller 15, an internal clock generator 16, and a controller 17.

The capacitive DAC 11 includes a plurality of capacitive elements C0, C1, . . . , and Cn and switches SW0, SW1, . . . , and SWn connected to the capacitive elements C0, C1, . . . , and Cn respectively. Each of the switches SW0, SW1, . . . , and SWn is connected to one terminal of a corresponding capacitive element C. The other terminal of each of the capacitive elements C0, C1, . . . , and Cn is connected to an inverting input terminal (indicated by "−" in FIG. 1) of the comparator 13. An input signal Vin, voltage Vrp, or voltage Vrm is supplied to the other terminal of each of the switches SW0, SW1, . . . , and SWn. It is assumed that voltage of the input signal Vin is, for example, within the range of the voltage Vrm to the voltage Vrp. For example, the voltage Vrm is ground voltage (0 V) and the voltage Vrp is power supply voltage. On the basis of a switch switching signal (digital code) from the controller 17, the capacitive DAC 11 turns on or off the switches SW0 through SWn and generates analog voltage.

When the capacitive DAC 11 samples the received input signal Vin, the reference voltage generator 12 generates reference voltage Vcm. At AD conversion time the comparator 13 compares the reference voltage Vcm and analog voltage outputted from the capacitive DAC 11. The reference voltage Vcm may also be referred to as internal common-mode voltage. The reference voltage generator 12 includes resistors R1 and R2 connected between power supply and ground and a switch SWa connected between a node N1 between the resistors R1 and R2 and the ground. A non-inverting input terminal (indicated by "+" in FIG. 1) of the comparator 13 is connected to the node N1. When an operation start signal EN changes to an H level, the switch SWa turns off. When the operation start signal EN changes to an L level, the switch SWa turns on.

The comparator 13 compares analog voltage outputted from the capacitive DAC 11 and reference voltage generated by the reference voltage generator 12 and outputs a result, in synchronization with an internal clock CKin generated by the internal clock generator 16.

The switch 14 is connected between the inverting input terminal and the non-inverting input terminal of the comparator 13. The switch 14 is on for sampling time (time for which a sampling clock CK is at an H level) and is off for AD conversion time (time for which the sampling clock CK is at an L level).

When the operation start signal EN is at the H level, the sampling time controller 15 receives a clock signal (external clock CKex) and detects a change in the reference voltage Vcm. When the reference voltage Vcm rises to a determined threshold Vth, the sampling time controller 15 determines that sampling is completed, and generates and outputs, on the basis of the external clock CKex, the sampling clock CK in which sampling time is controlled.

The internal clock generator 16 receives a sampling clock CK and generates an internal clock CKin which operates the comparator 13 during AD conversion time.

The controller 17 receives the sampling clock CK and the internal clock CKin. Each time the comparator 13 makes a comparison, the controller 17 outputs the switch switching signal for switching the switches SW0 through SWn so as to lessen the difference in voltage between a signal outputted from the capacitive DAC 11 and the reference voltage Vcm. Furthermore, the controller 17 includes an n-bit register (not illustrated) for holding a result of a comparison made by the comparator 13, and outputs an n-bit AD conversion result. In addition, a signal RES_SEL for switching AD conversion resolution is inputted from the outside to the controller 17. The controller 17 selects switches to be operated from among the switches SW0 through SWn included in the capacitive DAC 11 in response to the signal RES_SEL. By doing so, AD conversion resolution is switched.

With the above AD conversion circuit 10 the switches SW1 through SWn connect a signal line to which the input signal Vin is supplied to the capacitive elements C1 through Cn, respectively, at sampling time under the control of the controller 17. The switch SW0 connects a signal line to which the voltage Vrm, for example, is applied to the capacitive element C0.

In addition, the switch 14 is turned on by the sampling clock CK at an H level and the switch SWa is turned off by the operation start signal EN. Electric charges corresponding to the difference between the reference voltage Vcm and voltage of the input signal Vin are stored by the capacitive elements C1 through Cn. As indicated in FIG. 1, the reference voltage Vcm increases as a result of a transient response from timing t1 at which the sampling clock CK rises. A rate at which the reference voltage Vcm increases depends on the characteristics of the AD conversion circuit 10 or conditions under which the AD conversion circuit 10 operates.

The sampling time controller 15 detects a change in the reference voltage Vcm. When the reference voltage Vcm is smaller than a saturation value Vsat and rises to a determined threshold Vth (at timing t2) at which the sampling time controller 15 can consider sampling to have been completed, the sampling time controller 15 determines that the sampling is completed, and changes the sampling clock CK to the L level. The reason for this is that the reference voltage Vcm which has increased to a certain extent is sufficient to make an AD conversion.

The threshold Vth is an accuracy value corresponding to the resolution of the AD conversion circuit 10. For example, it is assumed that the difference between the reference voltage Vcm and the threshold Vth is smaller than or equal to (analog input voltage range (full-scale range))/$2^N$ (N is the resolution of the AD conversion circuit 10), that is to say, 1 LSB. For example, if the resolution of the AD conversion circuit 10 is 10 bits and an analog input voltage range is 3.0 V, then Vcm−Vth≤3.0/$2^{10}$≈2.9 (mV).

The value Vsat depends on the resistors R1 and R2. Therefore, the resistors R1 and R2 may be controlled to make the value Vsat small. By doing so, the threshold Vth becomes smaller and sampling time can be shortened.

This saves extra sampling time compared with a case where sampling time is set in advance with timing t3 at which the reference voltage Vcm is saturated (stabilized) taken into consideration.

Accordingly, it is possible to set short sampling time regardless of a duty ratio of an external clock without preparing a design for fixing sampling time and securing AD conversion time, depending on the characteristics of the AD conversion circuit 10 or conditions under which the AD conversion circuit 10 operates. For example, it is possible to set 20 percent of a sampling clock as sampling time without setting 25 percent of one cycle of an external clock as sampling time or setting the remaining 75 percent as AD conversion time, depending on, for example, conditions under which the AD conversion circuit 10 operates.

As sampling time can be reduced in this way, the remaining AD conversion time can correspondingly be lengthened. Accordingly, AD conversion resolution or the frequency of an external clock can be increased (details will be described later). As a result, different specifications on an external clock required (different requests on an AD conversion cycle made) by users can be met by one chip.

An example of the sampling time controller 15 will now be described.

(Example of Sampling Time Controller 15)

Figure 2:
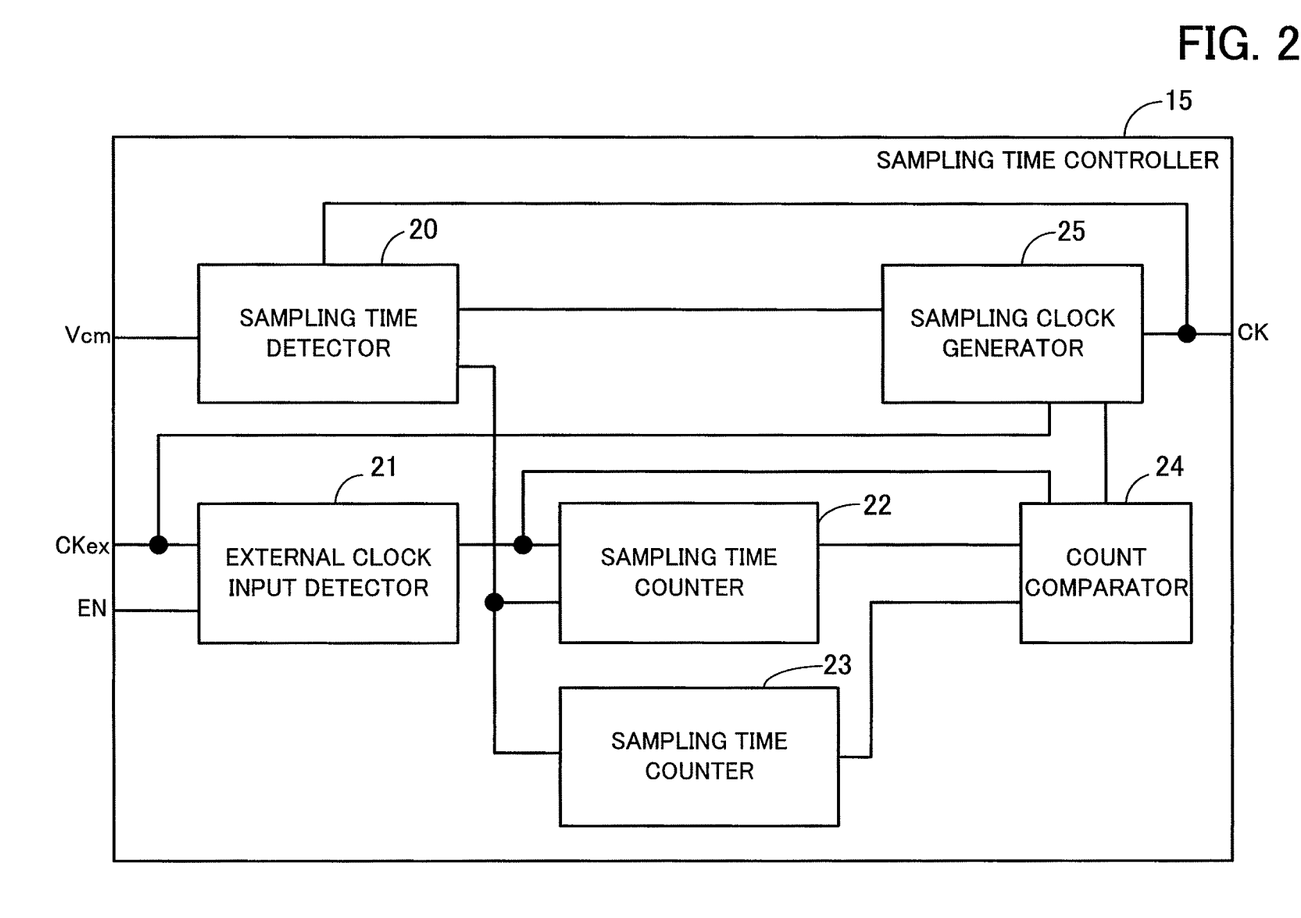
FIG. 2 indicates an example of a sampling time controller 15.

FIG. 2 indicates an example of the sampling time controller 15.

The sampling time controller 15 includes a sampling time detector 20, an external clock input detector 21, sampling time counters 22 and 23, a count comparator 24, and a sampling clock generator 25.

The sampling time detector 20 detects reference voltage Vcm which increases for time for which an external clock CKex is at an H level in the first clock cycle. Until the reference voltage Vcm exceeds a threshold, the sampling time detector 20 determines whether or not the reference voltage Vcm is greater than the threshold. Each time the sampling time detector 20 completes a determination, the sampling time detector 20 transmits to the sampling time counters 22 and 23 a determination completion signal which indicates that a determination is completed. Furthermore, the sampling time detector 20 includes an oscillation circuit. Until the reference voltage Vcm exceeds the threshold, the oscillation circuit continues to oscillate. When the reference voltage Vcm exceeds the threshold, the sampling time detector 20 transmits to the sampling clock generator 25 a sampling completion signal which indicates that the sampling time detector 20 completes sampling. The oscillation circuit also continues to oscillate during sampling time in second and later clock cycles of the external clock CKex.

An operation start signal EN and the external clock CKex are inputted to the external clock input detector 21. After an AD conversion operation is begun, the external clock input detector 21 determines whether a current clock cycle of the external clock CKex is the first clock cycle or the second or later clock cycle. The external clock input detector 21 then informs the sampling time counter 22 and the count comparator 24 of a determination result.

When the current clock cycle of the external clock CKex is the first clock cycle, the sampling time counter 22 counts sampling time as the number of determination completion signals transmitted from the sampling time detector 20 (number of oscillations of the oscillation circuit included in the sampling time detector 20). In addition, the sampling time counter 22 holds a count value counted in the first clock cycle of the external clock CKex. When the current clock cycle of the external clock CKex is the second or later clock cycle, the sampling time counter 22 outputs the held count value.

The sampling time counter 23 counts sampling time in the second or later clock cycle of the external clock CKex as the number of determination completion signals transmitted from the sampling time detector 20. The sampling time counter 23 may count the number of determination completion signals transmitted from the sampling time detector 20 even in the first clock cycle of the external clock CKex.

The count comparator 24 compares count values of the sampling time counters 22 and 23. However, the count comparator 24 does not output a comparison result in the first clock cycle of the external clock CKex. The count comparator 24 compares a count value held by the sampling time counter 22 and a count value outputted from the sampling time counter 23 in the second or later clock cycle of the external clock CKex. When the count values match, the count comparator 24 informs the sampling clock generator 25 of a sampling completion signal.

The sampling clock generator 25 generates and outputs a sampling clock CK by which time from the rise of the external clock CKex to notice of a sampling completion signal is set as sampling time. The sampling clock generator 25 uses in the first clock cycle of the external clock CKex a sampling completion signal of which the sampling time detector 20 informs the sampling clock generator 25. The sampling clock generator 25 uses in the second or later clock cycle of the external clock CKex a sampling completion signal of which the count comparator 24 informs the sampling clock generator 25.

(Operation of Sampling Time Controller 15)

Figure 3:
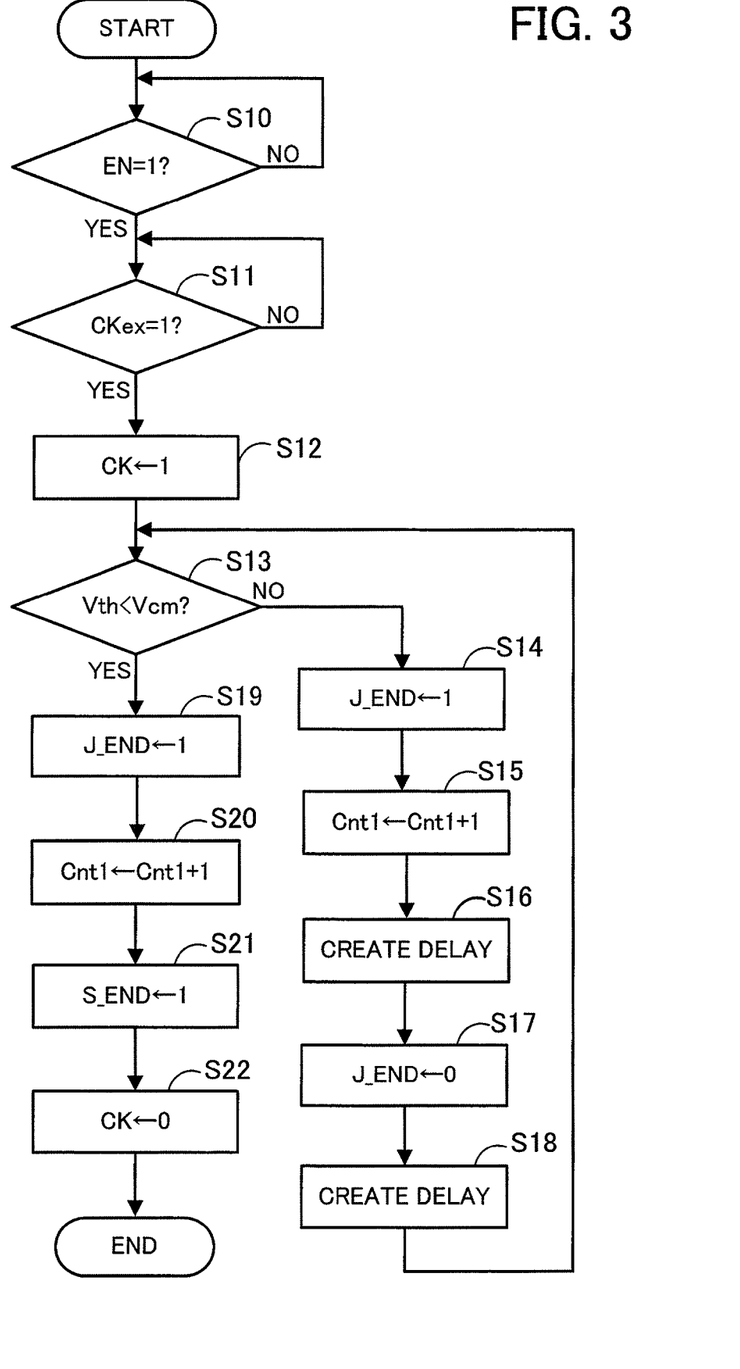
FIG. 3 is a flow chart of an example of the operation of a sampling time controller in a first clock cycle of an external clock CKex.

FIG. 3 is a flow chart of an example of the operation of the sampling time controller in the first clock cycle of the external clock CKex.

The external clock input detector 21 determines whether or not an operation start signal EN is "1" (at the H level) (step S10). If the operation start signal EN is "1", then step S11 is performed. If the operation start signal EN is "0" (at the L level), then step S10 is repeated until the operation start signal EN becomes "1".

In step S11, the sampling clock generator 25 determines whether or not an external clock CKex is "1". If the external clock CKex is "1", then the sampling clock generator 25 makes a sampling clock CK rise to "1" (step S12). If the external clock CKex is "0", then step S11 is repeated until the external clock CKex becomes "1".

After step S12 is performed, the sampling time detector 20 determines whether or not reference voltage Vcm is greater than a threshold Vth (step S13). If the reference voltage Vcm is smaller than the threshold Vth, then the sampling time detector 20 sets a determination completion signal J_END to "1" (step S14). As a result, the sampling time counter 22 increments a count value Cnt1 (step S15).

After that, the sampling time detector 20 creates a delay and keeps the determination completion signal J_END at "1" (step S16). Then the sampling time detector 20 changes the determination completion signal J_END to "0" (step S17). After that, the sampling time detector 20 creates a delay which is equal in length to the delay created in step S16, and keeps the determination completion signal J_END at "0" (step S18). Then the sampling time detector 20 performs step S13 again.

Similarly, if the reference voltage Vcm rises to the threshold Vth, the sampling time detector 20 sets the determination completion signal J_END to "1" (step S19). As a result, the sampling time counter 22 increments the count value Cnt1 (step S20). Furthermore, if the reference voltage Vcm rises to the threshold Vth, the sampling time detector 20 changes a sampling completion signal S_END to "1" (step S21). As a result, the sampling clock generator 25 makes the sampling clock CK fall to "0" (step S22).

Figure 4:
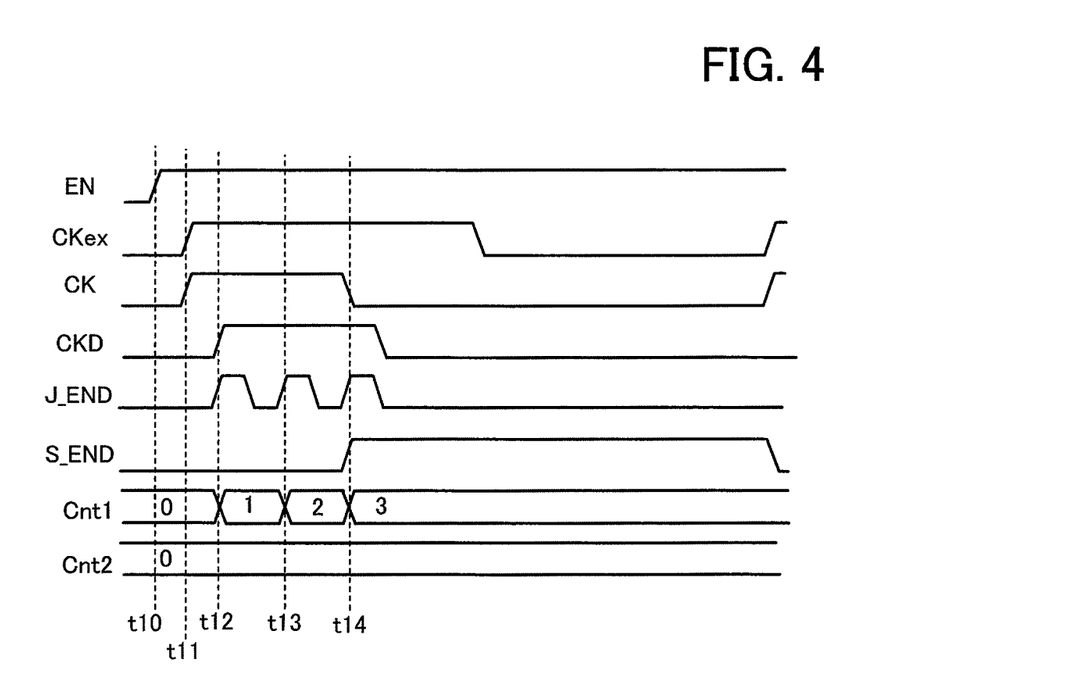
FIG. 4 is a timing chart of an example of the operation of the sampling time controller in the first clock cycle of the external clock CKex.

FIG. 4 is a timing chart of an example of the operation of the sampling time controller in the first clock cycle of the external clock CKex. FIG. 4 indicates an example of the operation start signal EN, the external clock CKex, the sampling clock CK, a delayed sampling clock CKD, the determination completion signal J_END, the sampling completion signal S_END, the count value Cnt1 of the sampling time counter 22, and a count value Cnt2 of the sampling time counter 23. An initial value of each signal is "0".

When the operation start signal EN rises to "1" (at timing t10) and the external clock CKex rises to "1" (at timing t11), the sampling clock generator 25 changes the sampling clock CK to "1".

The sampling time detector 20 begins to compare the reference voltage Vcm and the threshold Vth and determine whether or not the reference voltage Vcm is greater than the threshold Vth, in synchronization with the rise (at timing t12) of the sampling clock CKD obtained by delaying the sampling clock CK. When the sampling time detector 20 completes the determination, the sampling time detector 20 changes the determination completion signal J_END to "1". At this time the sampling time counter 22 increments the count value Cnt1 to "1".

The determination completion signal J_END is changed to "0" after the above delay. A determination is made again after the same delay and the determination completion signal J_END is changed again to "1" (at timing t13). At this time the sampling time counter 22 increments the count value Cnt1 to "2".

At timing t14, the determination completion signal J_END is changed again to "1" and the count value Cnt1 is incremented to "3". However, the sampling completion signal S_END is changed to "1". This indicates that the reference voltage Vcm is greater than the threshold Vth, that is to say, that sufficient sampling is completed. At this time the sampling clock generator 25 changes the sampling clock CK to "0", makes sampling time end, and makes AD conversion time begin.

Figure 5:
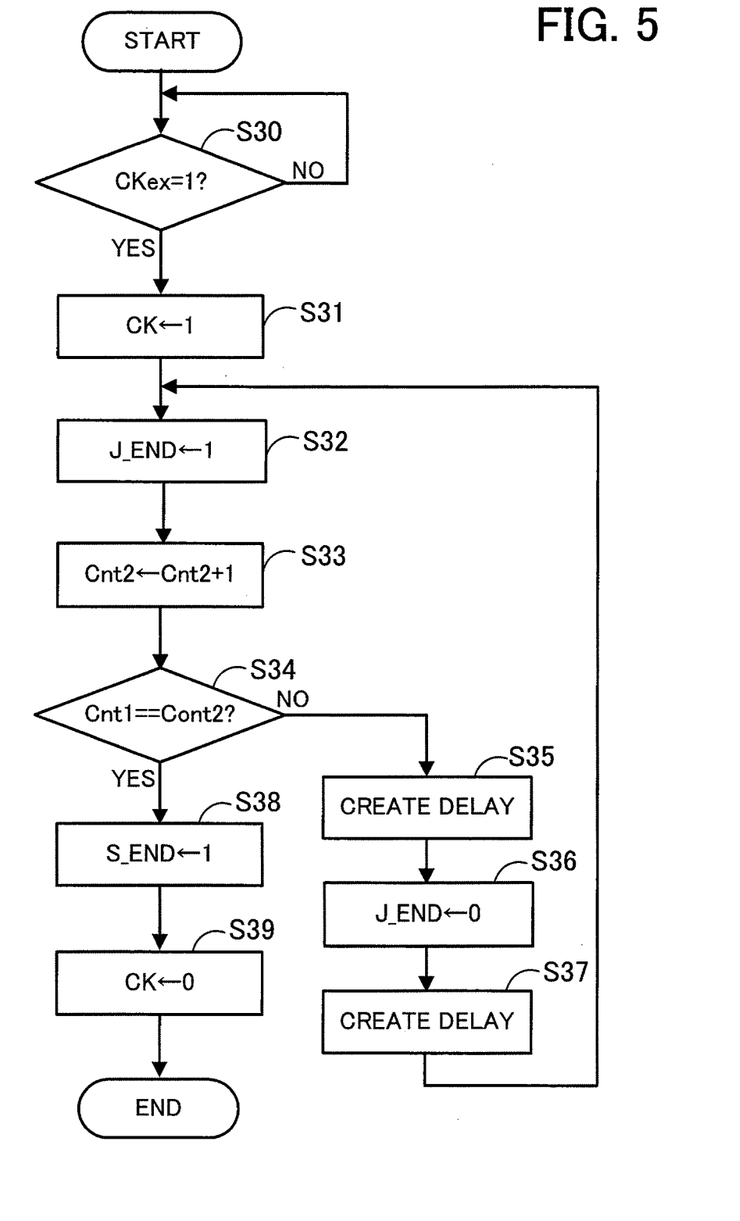
FIG. 5 is a flow chart of an example of the operation of the sampling time controller in second and later clock cycles of the external clock CKex.

FIG. 5 is a flow chart of an example of the operation of the sampling time controller in second and later clock cycles of the external clock CKex.

The sampling clock generator 25 determines whether or not the external clock CKex is "1" (step S30). If the external clock CKex is "1", then the sampling clock generator 25 makes the sampling clock CK rise to "1" (step S31). If the external clock CKex is "0", then step S30 is repeated until the external clock CKex becomes "1". After step S31 is performed, the sampling time detector 20 compares the reference voltage Vcm and the threshold Vth, determines whether or not the reference voltage Vcm is greater than the threshold Vth, and changes the determination completion signal J_END to "1" (step S32). This is the same with the first clock cycle of the external clock CKex. As a result, the sampling time counter 23 increments the count value Cnt2 (step S33).

After step S33 is performed, the count comparator 24 compares the count value Cnt1 of the sampling time counter 22 in the first clock cycle of the external clock CKex and the count value Cnt2 of the sampling time counter 23 in the second or later clock cycle of the external clock CKex (step S34).

If the count value Cnt2 is smaller than the count value Cnt1, then the sampling time detector 20 creates a delay which is equal in length to the delay created in the above step S16 or S18 (step S35), and then changes the determination completion signal J_END to "0" (step S36). After that, the sampling time detector 20 creates a delay which is equal in length to the delay created in step S35, keeps the determination completion signal J_END at "0" (step S37), and performs step S32 again.

If the count value Cnt2 matches the count value Cnt1, then the count comparator 24 changes the sampling completion signal S_END to "1" (step S38). As a result, the sampling clock generator 25 makes the sampling clock CK fall to "0" (step S39).

Figure 6:
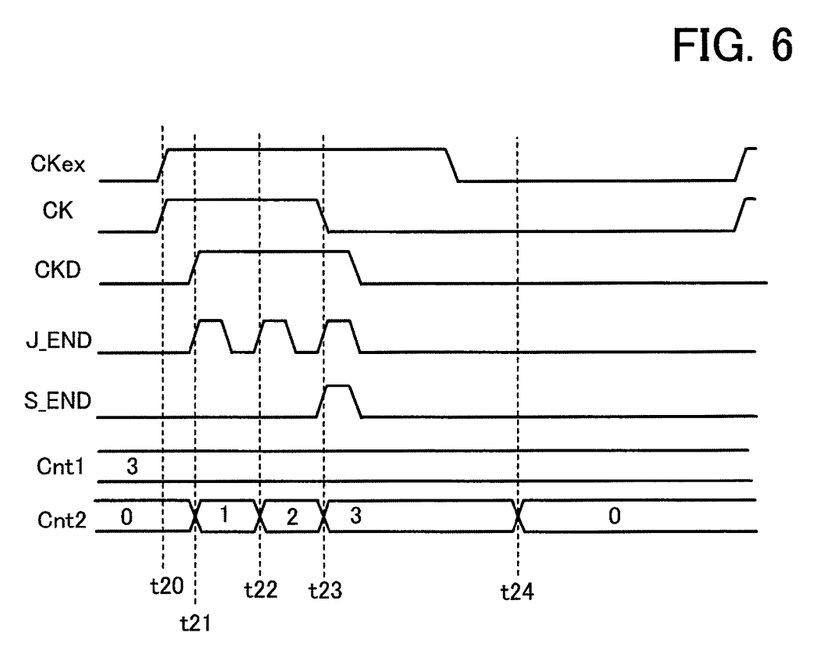
FIG. 6 is a timing chart of an example of the operation of the sampling time controller in the second and later clock cycles of the external clock CKex.

FIG. 6 is a timing chart of an example of the operation of the sampling time controller in the second and later clock cycles of the external clock CKex. FIG. 6 indicates an example of the external clock CKex, the sampling clock CK, the delayed sampling clock CKD, the determination completion signal J_END, the sampling completion signal S_END, the count value Cnt1 of the sampling time counter 22, and the count value Cnt2 of the sampling time counter 23. The count value Cnt1 is "3" and an initial value of each of the other signals is "0".

When the external clock CKex rises to "1" (at timing t20), the sampling clock generator 25 changes the sampling clock CK to "1".

The sampling time detector 20 begins to compare the reference voltage Vcm and the threshold Vth and determine whether or not the reference voltage Vcm is greater than the threshold Vth, in synchronization with the rise (at timing t21) of the sampling clock CKD obtained by delaying the sampling clock CK. When the sampling time detector 20 completes the determination, the sampling time detector 20 changes the determination completion signal J_END to "1". At this time the sampling time counter 23 increments the count value Cnt2 to "1".

The determination completion signal J_END is changed to "0" after the above delay. A determination is made again after the same delay and the determination completion signal J_END is changed again to "1" (at timing t22). At this time the sampling time counter 23 increments the count value Cnt2 to "2". At timing t23, the determination completion signal J_END is changed again to "1" and the count value Cnt2 is incremented to "3". The count value Cnt2 matches the count value Cnt1. As a result, the count comparator 24 changes the sampling completion signal S_END to "1". At this time the sampling clock generator 25 changes the sampling clock CK to "0", makes sampling time end, and makes AD conversion time begin.

After that, the count value Cnt2 of the sampling time counter 23 is reset to "0" by, for example, a reset signal from the outside (at timing t24).

As has been described, the sampling time controller 15 detects a change in the reference voltage Vcm. When the reference voltage Vcm rises to the determined threshold Vth at which the sampling time controller 15 can consider sampling to have been completed, the sampling time controller 15 changes the sampling completion signal S_END to "1" and makes sampling time end. This saves extra sampling time.

Accordingly, it is possible to set short sampling time regardless of a duty ratio of an external clock without preparing a design for fixing sampling time and securing AD conversion time, depending on the characteristics of the AD conversion circuit 10 or conditions under which the AD conversion circuit 10 operates. As sampling time can be reduced in this way, the remaining AD conversion time can correspondingly be lengthened. Accordingly, resolution with which a sequential comparison type AD conversion is made or the frequency of the external clock CKex can be increased.

In addition, the count comparator 24 outputs the sampling completion signal S_END in the second or later clock cycle of the external clock CKex according to a result obtained by comparing the count value Cnt1 indicative of sampling time which is determined in the first clock cycle of the external clock CKex and the count value Cnt2. As a result, the same sampling time is easily set in the second or later clock cycle of the external clock CKex by comparing the two count values Cnt1 and Cnt2.

Figure 7:
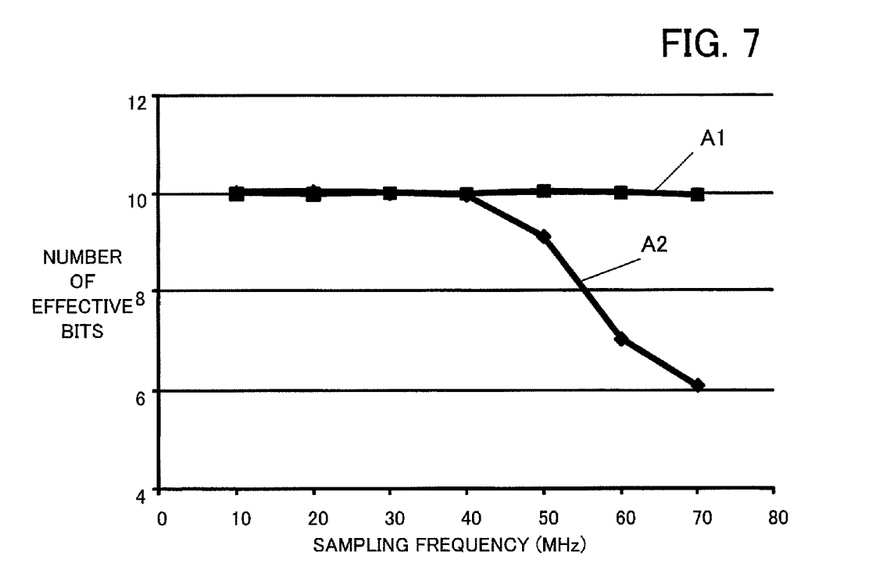
FIG. 7 indicates an example of an effect obtained by the AD conversion circuit according to the embodiment.

FIG. 7 indicates an example of an effect obtained by the AD conversion circuit according to the embodiment. In FIG. 7, a horizontal axis indicates a sampling frequency (MHz) indicative of the operating speed of the AD conversion circuit and a vertical axis indicates the number of effective bits at AD conversion time.

A waveform A1 indicates an SNDR (Signal-to-Noise and Distortion Ratio) obtained in the case of using the sampling time controller 15, and a waveform A2 indicates for comparison an SNDR obtained in the case of not using the sampling time controller 15. An SNDR is calculated by SPICE (Simulation Program with Integrated Circuit Emphasis).

It is assumed that a duty ratio of an external clock is 50% in both of the cases of the waveforms A1 and A2. In addition, a post-layout net list is used for the capacitive DAC 11 and an analog operation model (Verilog-A) is used for the comparator 13, the sampling time controller 15, and the controller 17.

As indicated by the waveform A2 which is obtained in the case of not using the sampling time controller 15, if the operating speed increases, the width of an H or L level of a sampling clock at AD conversion time may not be secured. The reason for this is that a duty ratio of the sampling clock is equal to the duty ratio of the external clock (50%). As a result, conversion accuracy deteriorates.

With the waveform A1 which is obtained in the case of using the sampling time controller 15, on the other hand, even if the operating speed increases, the width of an H or L level of a sampling clock at AD conversion time can be secured by the sampling time controller 15. Accordingly, as can be seen from FIG. 7, the number of effective bits does not decrease and conversion accuracy is maintained.

(Semiconductor Device Including AD Conversion Circuit)

Figure 8:
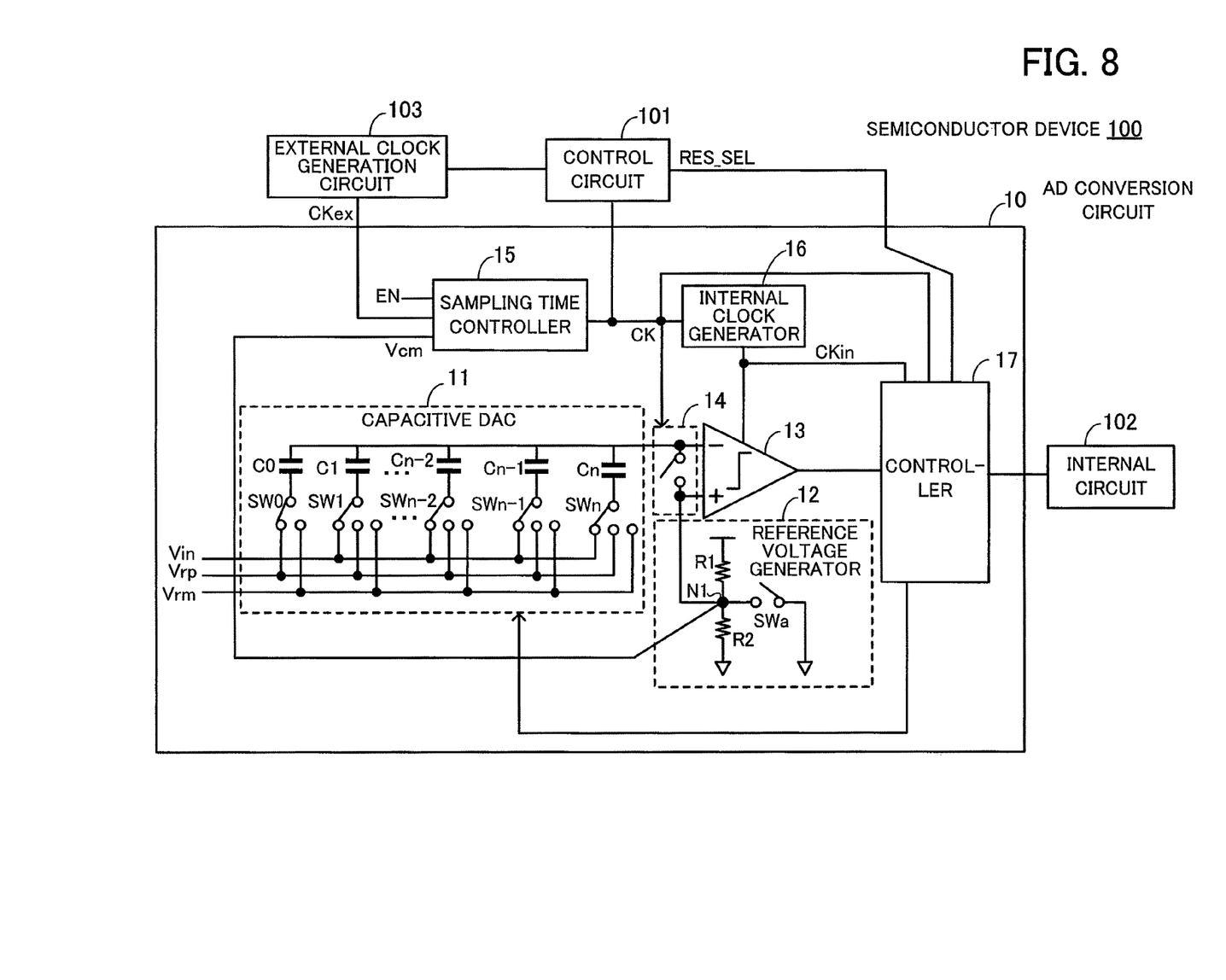
FIG. 8 indicates an example of a semiconductor device including the AD conversion circuit.

FIG. 8 indicates an example of a semiconductor device including the AD conversion circuit.

A semiconductor device 100 is a semiconductor integrated circuit such as an ASIC (Application Specific Integrated Circuit) and includes a control circuit 101, an internal circuit 102, an external clock generation circuit 103, and the like in addition to the above AD conversion circuit 10.

The control circuit 101 controls the whole of the semiconductor device 100. For example, the control circuit 101 supplies to the controller 17 a signal RES_SEL used for switching AD conversion resolution according to a duty ratio of a sampling clock CK generated by the sampling time controller 15. Furthermore, the control circuit 101 may control the external clock generation circuit 103 so as to change the frequency of an external clock CKex according to the duty ratio of the sampling clock CK generated by the sampling time controller 15.

The internal circuit 102 processes a digital signal which is an AD conversion result outputted from the controller 17 of the AD conversion circuit 10.

If the control circuit 101 detects that the duty ratio of the sampling clock CK is 25% (sampling time is 25 percent of one cycle), then the control circuit 101 supplies to the controller 17 a signal RES_SEL for designating to make an AD conversion with a resolution of, for example, (n−2) bits. In that case, the controller 17 of the AD conversion circuit 10 makes an AD conversion by operating the switches SW0 through SW(n−2) of the capacitive DAC 11.

On the other hand, if the control circuit 101 detects that the duty ratio of the sampling clock CK is 20%, then the control circuit 101 supplies to the controller 17 a signal RES_SEL for designating to make an AD conversion with a resolution of, for example, n bits. In that case, the controller 17 of the AD conversion circuit 10 makes an AD conversion by operating the switches SW0 through SWn of the capacitive DAC 11.

Figure 9:
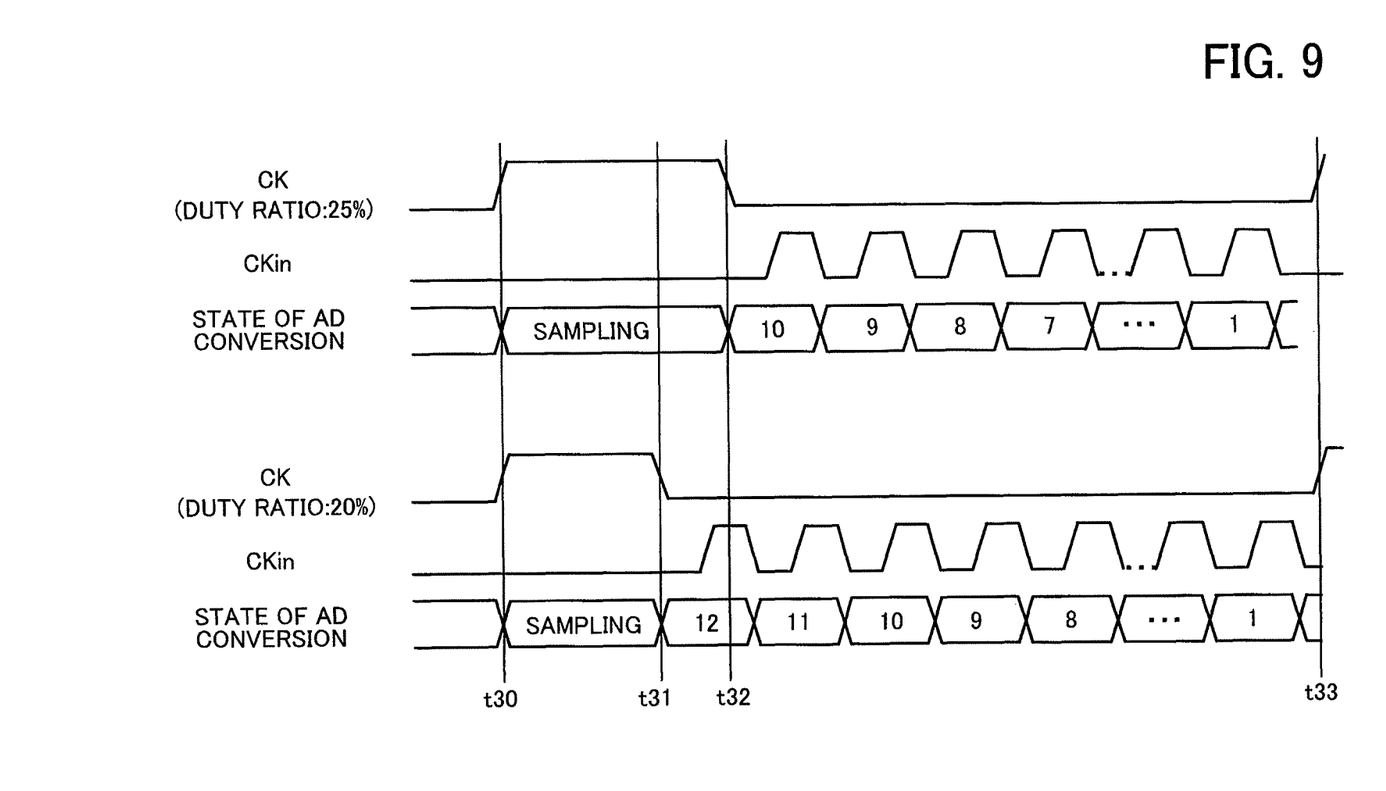
FIG. 9 is a timing chart of an example of a change in AD conversion resolution corresponding to a change in duty ratio.

FIG. 9 is a timing chart of an example of a change in AD conversion resolution corresponding to a change in duty ratio. FIG. 9 indicates a sampling clock CK, an internal clock CKin, and a state of an AD conversion on the same time axis in the case of duty ratios of the sampling clock CK being 25% and 20%.

If a duty ratio of the sampling clock CK is 25%, then the sampling clock CK rises at timing t30 and sampling time begins. When the sampling clock CK falls at timing t32, AD conversion time lasts until timing t33 at which the sampling clock CK rises. The internal clock generator 16 generates the internal clock CKin during the AD conversion time and an AD conversion is made in synchronization with the internal clock CKin. In the example of FIG. 9, a 10-bit AD conversion is made in order from the most significant bit.

On the other hand, if a duty ratio of the sampling clock CK is 20%, then the sampling clock CK rises at the timing t30 and sampling time begins. The sampling clock CK falls at timing t31 which is earlier than the timing t32 at which the sampling clock CK falls in the case of a duty ratio of the sampling clock CK being 25%. As a result, AD conversion time is from the timing t31 to the timing t33 at which the sampling clock CK rises. That is to say, the AD conversion time is longer than the AD conversion time set in the case of a duty ratio of the sampling clock CK being 25%. As a result, the number of the internal clock CKin generated is larger than that of the internal clock CKin generated in the case of a duty ratio of the sampling clock CK being 25%. This means that an AD conversion is made in bits (12 bits in the example of FIG. 9) the number of which is larger than that of bits in which an AD conversion is made in the case of a duty ratio of the sampling clock CK being 25%. Accordingly, AD conversion resolution can be increased.

Figure 10:
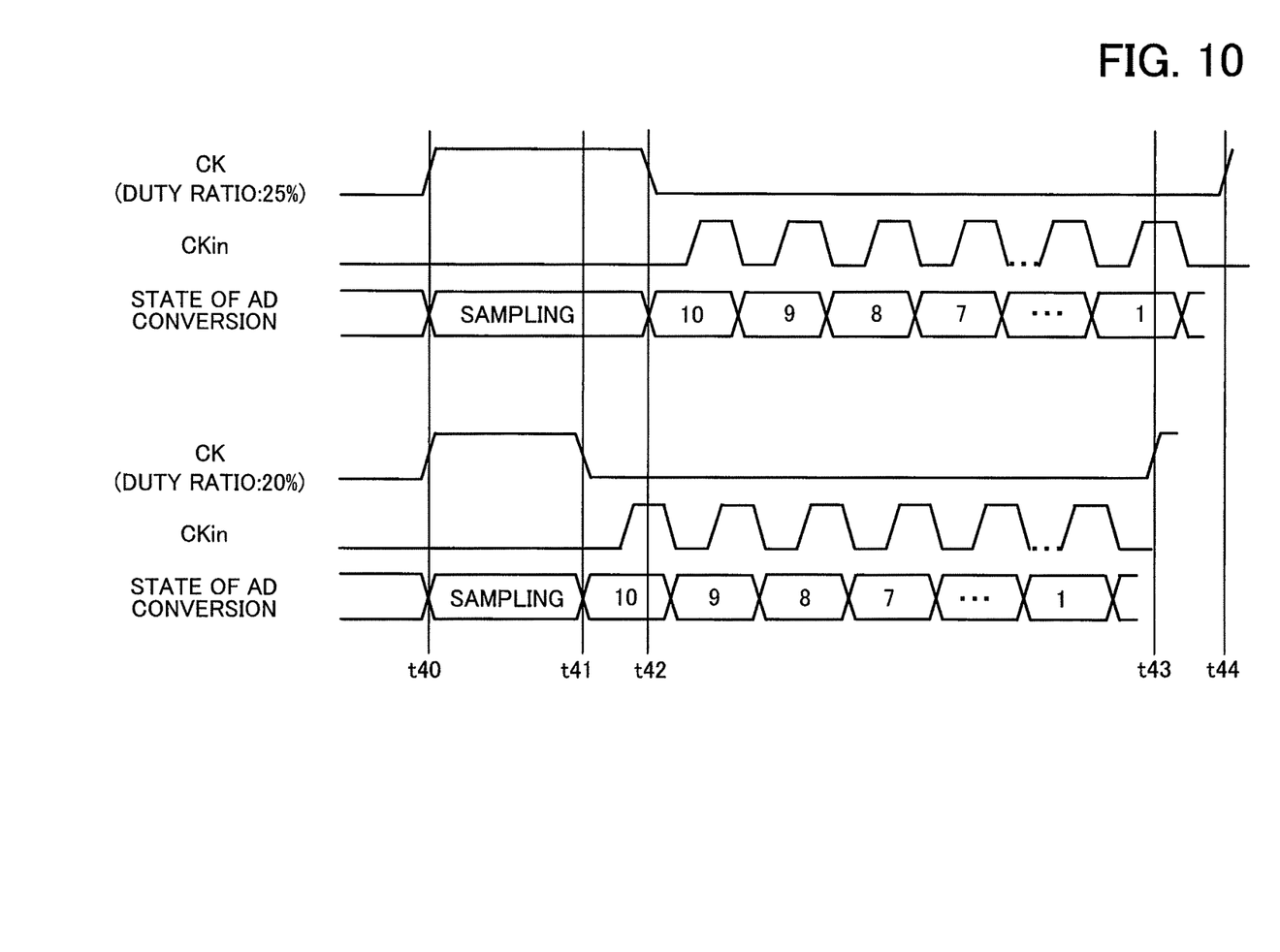
FIG. 10 is a timing chart of an example of a change in the cycle of a sampling clock corresponding to a change in duty ratio.

FIG. 10 is a timing chart of an example of a change in the cycle of a sampling clock corresponding to a change in duty ratio.

If a duty ratio of a sampling clock CK is 25%, then sampling is performed from timing t40 to timing t42 and an AD conversion is made from the timing t42 to timing t44. In the example of FIG. 10, a 10-bit AD conversion is also made in order from the most significant bit.

If a duty ratio of the sampling clock CK is 20%, then the external clock generation circuit 103 increases the frequency of a generated external clock CKex under the control of the control circuit 101. As a result, as indicated in FIG. 10, the cycle of the sampling clock CK is from the timing t40 to timing t43 and is shorter than that of the sampling clock CK the duty ratio of which is 25%.

Even in this case, sampling time is from the timing t40 to timing t41 and is shorter than sampling time set in the case of a duty ratio of the sampling clock CK being 25%. Accordingly, AD conversion time is from the timing t41 to the timing t43 and its length is almost the same as that of AD conversion time secured in the case of a duty ratio of the sampling clock CK being 25%. As a result, as indicated in FIG. 10, a 10-bit AD conversion, for example, can be made. This is the same with the case where a duty ratio of the sampling clock CK is 25%.

By the way, in the above embodiment the sequential comparison type AD conversion circuit 10 has been described. However, the sampling time controller 15 cal also be applied to a pipeline AD conversion circuit or a flash AD conversion circuit.

(Modification 1)

Figure 11:
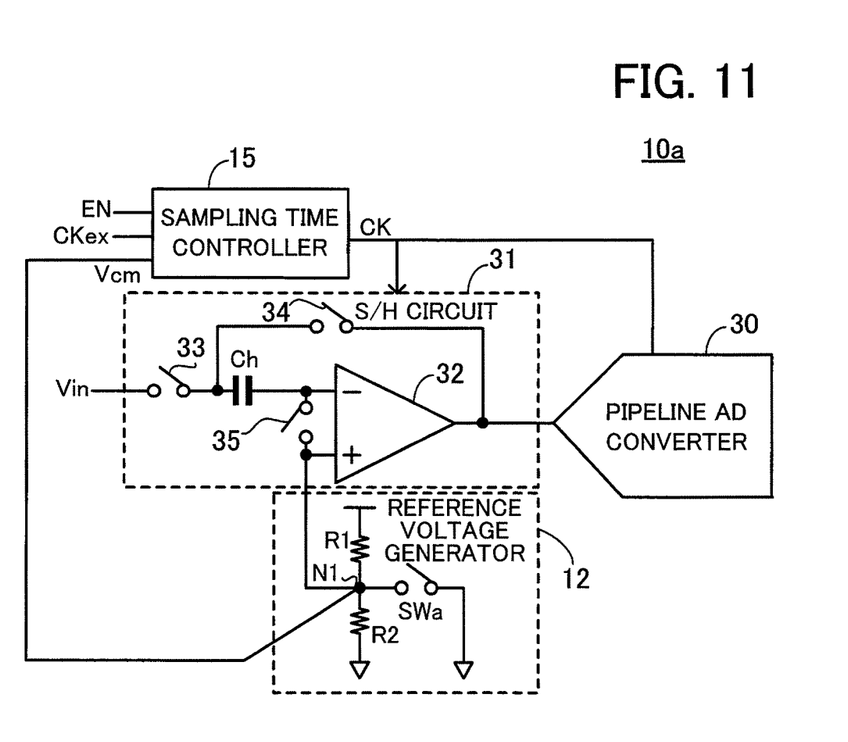
FIG. 11 indicates an example of a pipeline AD conversion circuit.

FIG. 11 indicates an example of a pipeline AD conversion circuit. Components in FIG. 11 which are the same as those illustrated in FIG. 1 are marked with the same numerals.

A pipeline AD conversion circuit 10a includes a pipeline AD converter 30 and an S/H (Sample/Hold) circuit 31.

The pipeline AD converter 30 makes an AD conversion at a plurality of stages and outputs at each stage one or more bits which are an AD conversion result. The pipeline AD converter 30 makes an AD conversion on the basis of a sampling clock CK generated by a sampling time controller 15.

The S/H circuit 31 includes an amplifier 32, switches 33, 34, and 35, and a capacitive element Ch.

A reference voltage generator 12 is connected to a non-inverting input terminal of the amplifier 32 and one terminal of the capacitive element Ch is connected to an inverting input terminal of the amplifier 32. An input signal Vin is inputted to the other terminal of the capacitive element Ch via the switch 33. Furthermore, the other terminal of the capacitive element Ch is connected to an output terminal of the amplifier 32 via the switch 34. The output terminal of the amplifier 32 is also connected to the pipeline AD converter 30.

In addition, the switch 35 is connected between the inverting input terminal and non-inverting input terminal of the amplifier 32. The switch 35 is on for sampling time (time for which the sampling clock CK is at an H level) and is off for AD conversion time (time for which the sampling clock CK is at an L level). This is the same with the switch 14 illustrated in FIG. 1.

With the above pipeline AD conversion circuit 10a the switches 33, 34, and 35 are on, off, and on, respectively, at sampling time by the sampling clock CK.

Furthermore, a switch SWa is turned off by an operation start signal EN. Electric charges corresponding to the difference between reference voltage Vcm and voltage of the input signal Vin are stored by the capacitive element Ch. The reference voltage Vcm increases as a result of a transient response from timing at which the sampling clock CK rises.

The sampling time controller 15 detects a change in the reference voltage Vcm. When the reference voltage Vcm rises to a determined threshold at which the sampling time controller 15 can consider sampling to have been completed, the sampling time controller 15 determines that the sampling is completed, and changes the sampling clock CK to the L level. This saves extra sampling time compared with a case where sampling time is set in advance with timing at which the reference voltage Vcm is stabilized taken into consideration.

Accordingly, it is possible to set short sampling time without preparing a design for fixing sampling time and securing AD conversion time, depending on the characteristics of the AD conversion circuit 10a or conditions under which the AD conversion circuit 10a operates. As sampling time can be reduced in this way, the frequency of an external clock inputted at pipeline AD conversion time can be increased. As a result, a high-speed AD conversion is realized.

(Modification 2)

Figure 12:
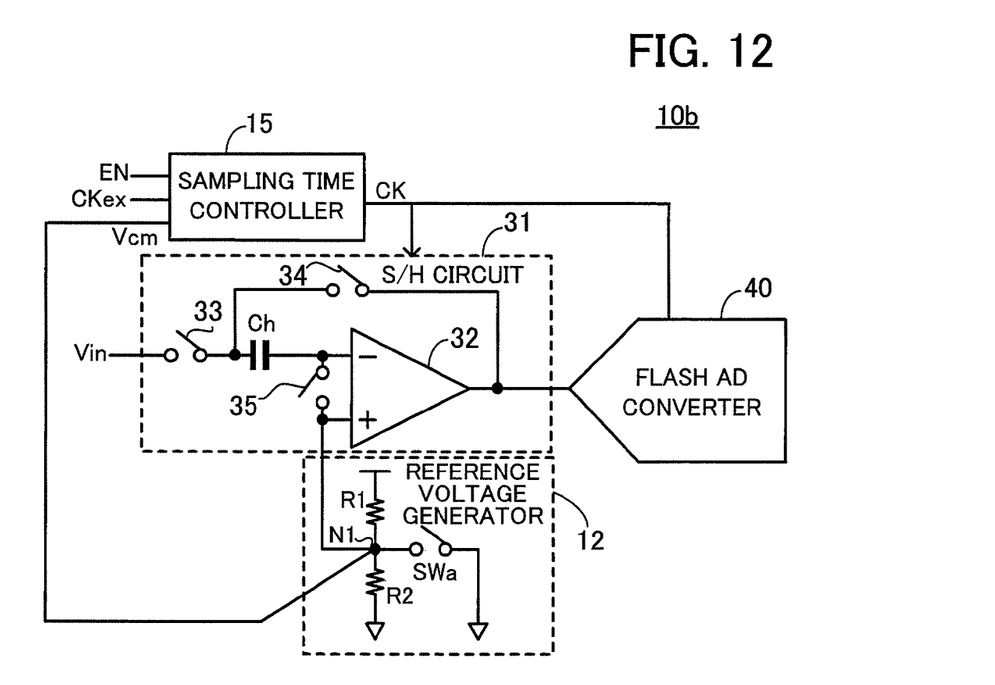
FIG. 12 indicates an example of a flash AD conversion circuit.

FIG. 12 indicates an example of a flash AD conversion circuit. Components in FIG. 12 which are the same as those illustrated in FIG. 11 are marked with the same numerals.

A flash AD conversion circuit 10b includes a flash AD converter 40. The flash AD converter 40 compares an analog input signal and a reference signal at once by the use of a plurality of comparators arranged in parallel, and obtains an AD conversion result by performing a comparison operation once.

By using this flash AD conversion circuit 10b, sampling time is controlled by a sampling time controller 15 and the same effect is obtained.

According to the disclosed AD conversion circuit, semiconductor device, and AD conversion method, extra sampling time is saved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. An AD conversion circuit comprising:
   a reference voltage generator which generates a reference voltage at the time of sampling a received input signal; and
   a sampling time controller which detects a change in the reference voltage, which determines at the time of the reference voltage rising to a determined threshold that sampling is completed, and which generates a sampling clock in which sampling time is controlled on the basis of an external clock.

2. The AD conversion circuit according to claim 1, wherein the determined threshold is smaller than a saturation value of the reference voltage.

3. The AD conversion circuit according to claim 1, wherein the sampling time controller makes a comparison between the reference voltage and the determined threshold every determined timing in a first clock cycle of the external clock, holds a number of times the comparison is made until the reference voltage rises to the determined threshold, and determines the sampling time in a second or later clock cycle of the external clock on the basis of the held number of times the comparison is made.

4. A semiconductor device comprising an AD conversion circuit, the AD conversion circuit including:
   a reference voltage generator which generates a reference voltage at the time of sampling a received input signal; and
   a sampling time controller which detects a change in the reference voltage, which determines at the time of the reference voltage rising to a determined threshold that sampling is completed, and which generates a sampling clock in which sampling time is controlled on the basis of an external clock.

5. The semiconductor device according to claim 4 further comprising a control circuit which gives the AD conversion circuit instructions, according to a duty ratio of the sampling clock generated by the sampling time controller, to switch AD conversion resolution.

6. The semiconductor device according to claim 4 further comprising:
   an external clock generator which generates the external clock; and
   a control circuit which gives the external clock generator instructions, according to a duty ratio of the sampling clock generated by the sampling time controller, to change a frequency of the external clock.

7. An AD conversion method comprising:
   detecting a change in a reference voltage at the time of sampling a received input signal; and
   determining at the time of the reference voltage rising to a determined threshold that sampling is completed, and generating a sampling clock in which sampling time is controlled on the basis of an external clock.

* * * * *